United States Patent [19]

Schmatz

[11] Patent Number: 4,965,142
[45] Date of Patent: Oct. 23, 1990

[54] MOLYBDENUM-PLATINUM-OXIDE ELECTRODES FOR THERMOELECTRIC GENERATORS

[75] Inventor: Duane J. Schmatz, Dearborn Heights, Mich.

[73] Assignee: Ford Motor Company, Dearborn, Mich.

[21] Appl. No.: 359,597

[22] Filed: Jun. 1, 1989

[51] Int. Cl.⁵ .................. H01M 6/36; B05D 5/12
[52] U.S. Cl. ..................... 429/11; 429/104; 204/192.3; 427/126.5; 427/255.3
[58] Field of Search ............ 429/11, 104; 204/192.3; 427/126.3, 126.5, 255.3; 29/623.1

[56] References Cited

U.S. PATENT DOCUMENTS 3,458,356  5/1966  Kummer et al.
3,856,647  12/1974  Blachman .......................... 204/192
4,042,757  8/1977  Jones ................................. 429/104
4,049,877  9/1977  Saillant et al. ..................... 429/11
4,175,164  11/1979  Cole ................................. 429/11
4,253,931  3/1981  Gold et al. ..................... 209/129 SP
4,509,254  4/1985  Damrow et al. ............ 429/126.3 X
4,510,210  4/1985  Hunt ................................ 429/11
4,661,229  4/1987  Hemming et al. ............. 204/192.13
4,847,171  7/1989  Schmatz ............................ 429/11
4,871,626  10/1989  Williams .......................... 429/11

Primary Examiner—Stephen J. Kalafut
Attorney, Agent, or Firm—Lorraine S. Melotik; Roger L. May

[57] ABSTRACT

The invention is directed to a composite article suitable for use in thermoelectric generators. The article comprises a solid electrolyte carrying a thin film comprising molybdenum-platinum-oxide as an electrode deposited by physical deposition techniques. The invention is also directed to the method of making same.

20 Claims, 2 Drawing Sheets

MOLYBDENUM-PLATINUM-OXIDE ELECTRODES FOR THERMOELECTRIC GENERATORS

The invention disclosed herein was made under, or in the course of Department of Energy Contract No. DE-AC02-CE40651. Reference is made to U.S. application Ser. No. 166,133 to Schmatz filed Mar. 10, 1988 which contains related subject matter and is commonly assigned with this application.

TECHNICAL FIELD

This invention relates to a composite article comprising a thin film comprising molybdenum-platinum-oxide as an electrode on solid electrolyte, which article is suitable for use in thermoelectric generators.

BACKGROUND OF THE INVENTION

Thermoelectric generator devices convert heat energy from a heat source directly to electrical energy. In one type of thermoelectric generator, the electrical energy is generated by electrochemically expanding alkali metal across a solid electrolyte. Such generators, wherein sodium metal is employed as the working substance, have been described in U.S. Pat. Nos. 3,458,356 and 4,510,210, and are commonly referred to as "sodium heat engines" (referred to herein as "SHE"). This type of thermoelectric generator is discussed herein as exemplary of one type of generator in which the article of this invention may be suitably used.

The sodium heat engine generally comprises a closed container separated into a first and second reaction zone by a solid electrolyte. Liquid sodium metal is present in the first reaction zone (i.e., on one side of the solid electrolyte). In the second reaction zone (i.e., on the other side of the solid electrolyte), a permeable, electrically conducting electrode is in contact with the solid electrolyte. During operation of such a device, a heat source raises the temperature of liquid sodium metal within the first reaction zone to a high temperature and corresponding high vapor pressure, which creates a sodium vapor pressure difference across the solid electrolyte. In response to this pressure difference, the elemental sodium gives up electrons to the negative electrode in contact with the sodium metal and the resulting sodium ions migrate through the solid electrolyte. The electrons, having passed through an external load, neutralize sodium cations at the permeable, positive electrode-solid electrolyte interface. Elemental sodium metal evaporates from the permeable electrode and migrates through the low pressure second reaction zone to a low temperature condenser. The condensed liquid sodium may then be returned back to the higher temperature first reaction zone.

In the thermoelectric generator system just described, the electrode on the surface of the electrolyte from which the alkali metal ions emerge is a positive electrode and must be present in order to transfer electronic charge from the external circuit to the alkali metal ions. This completes the electrochemical circuit required for operation of the generator. The operation of such thermoelectric generator systems require electrodes possessing special properties, some of which are difficult to optimize simultaneously. For example, it is necessary for efficient generator operation that the positive electrode conduct electrons from the electrical load to a broad surface of the electrolyte, doing so with low electrical resistance. At the same time, it is also necessary for the positive electrode to permit the passage of alkali metal atoms from the electrolyte-electrode interface through the electrode to the opposite electrode surface, from which they may pass to the condenser. While the former requirement is more likely to be attained by dense, thick electrodes to promote low resistance, the latter requirement suggests thin, permeable electrodes to promote the easy passage of the alkali metal through the electrode. Additionally, the electrodes must be relatively unreactive with the alkali metal and have low vapor pressure to prevent their loss through evaporation in the high temperature, high vacuum environment in which they operate. Still further, the electrode material must have a thermal expansion coefficient offering a fair match to that of the electrolyte substance. This is necessary in order to prevent delamination of the electrode from the electrolyte which could result from differential expansion and contraction of the electrode and electrolyte materials during the heating and cooling cycles to which such systems are exposed during use.

U.S. Pat. No. 4,049,877, to Saillant et al, is directed to a thermoelectric generator wherein the improvement comprises employing, as the electrode, a porous metal film deposited on the solid electrolyte by chemical deposition specifically chemical vapor deposition. Among the metals taught as suitable for use as the electrode are molybdenum, tungsten, chromium, nickel and iron. Cole, in U.S. Pat. No. 4,175,164, teaches that the surface configuration of metal electrodes formed, e.g., by chemical deposition techniques (such as those in the above Saillant et al patent) may be modified by subsequently exposing such deposited electrodes to oxidizing conditions, followed by reducing conditions. It is suggested by Cole that these conditions effect an oxidation, reduction and consequent redeposition in the already deposited electrode material, e.g., molybdenum, and modify the surface configuration which makes it desirably more porous, thus providing improved electrode efficiency.

It may be that sodium molybdates may be desirably formed on the surface and in the pores of Cole's electrode in the presence of sodium and oxygen (from the oxidizing conditions described in that patent), resulting in the excellent initial power of the Cole electrode. However, during operation of sodium heat engine it is believed that any molybdates formed at the molybdenum surface and in the pores of the Cole electrode evaporate rapidly, leaving a solid, less permeable molybdenum electrode. It is believed that the loss of these liquid phases through evaporation or decomposition leads to a dramatic decrease in power output in a short period of time, e.g., 50–150 hours as shown in FIG. 1.

U.S. application Ser. No. 166,133 disclosed above is directed to an article suitable for use in thermoelectric generators. The article comprises a thin film electrode comprising molybdenum oxide on solid electrolyte. The molybdenum oxide is deposited by physical deposition of molybdenum in an atmosphere comprising at least 10% oxygen by volume. This electrode, as compared to that of Cole, is disclosed to incorporate oxygen substantially uniformly throughout the bulk of the electrode, probably as some form of molybdenum oxide. Thus it has been described as being able to maintain its power over a relatively long period of operation, particularly in comparison to the Cole electrode, as also shown in FIG. 1.

DISCLOSURE OF THE INVENTION

This invention is directed to an article suitable for use in thermoelectric generators. The article comprises a solid electrolyte carrying thereon a thin film electrode comprising molybdenum-platinum-oxide, wherein the electrode has a thickness between about 0.5 and about 10 μm (microns). The electrode is deposited by physical deposition of molybdenum and platinum in an atmosphere comprising at least 10% oxygen (by volume). The platinum in the film is present in an amount between about 5 to 20 mole percent based on the total moles of molybdenum and platinum.

Preferably, such physical deposition is selected from such physical deposition techniques as reactive sputtering, ion beam sputtering and ion plating. This electrode (i) comprises a substantially uniform dispersion of molybdenum oxide and platinum or platinum oxide in molybdenum or (ii) consists essentially of molybdenum oxide and platinum or platinum oxide. The amount of molybdenum oxide in the electrode would depend on the percentage of oxygen in the atmosphere and replenishment (flow rate), during the physical deposition of the molybdenum. The nature and dispersion of the platinum will likewise depend on the sputtering conditions. Hereinafter, this electrode comprising molybdenum-platinum-oxide in part or in total will be referred to as the "molybdenum-platinum-oxide electrode". A layer of molybdenum, platinum, or preferably molybdenum-platinum, preferably having a thickness between about 10 and about 1000 Angstroms, may be present between the molybdenum-platinum-oxide electrode and the solid electrolyte and/or on top of the molybdenum-platinum-oxide electrode. According to other aspects of the invention, it is directed to a method for making the article described above and to an article made by this method. According to yet another aspect, this invention is directed to thermoelectric generator device comprising the article disclosed above.

The novel electrode materials of the present invention exhibit the aforementioned properties desired for thermoelectric generators. In the present invention electrode, it is believed that oxygen is uniformly incorporated within the bulk of the electrode as some form of molybdenum oxide, most probably $MoO_3$. While not wishing to be bound by theory, it is further believed that the molybdenum oxide of the invention electrode advantageously reacts with the sodium of the cell to form sodium molybdates within the bulk of the electrode, which molybdates are molten at the cell operating temperature. Such liquid phases provide both a conducting path for the diffusion transport of neutral sodium and good physical contact between electrode and electrolyte. It is yet further believed that the platinum, forming either an oxide or remaining as elemental platinum, acts to incorporate and retain excessive amounts of oxygen in the electrode because of its catalytic properties. It is further believed that it may advantageously provide a new supply of oxygen as the molybdenum oxide evaporates. Because of the uniformity of molybdenum oxide throughout the bulk of the physically deposited electrode film of the invention and the catalytic effect of the platinum with oxygen, the evaporation rate of the sodium molybdates that form during operation of the cell is decreased substantially producing high power output in the cell for extended times. Thus, embodiments of the molybdenum-platinum-oxide electrodes of the present invention were found to have improved power output and to maintain their power output for longer periods of time as compared to similar molybdenum oxide electrodes of Schmatz. Embodiments of the molybdenum-platinum-oxide electrodes of this invention were desirably found to maintain their performance for at least 1000 hours. The theory put forth as to the reason this invention electrode maintains its high power output for extended periods of time is presented only as a possible explanation and not as a limitation of the invention. Neither its understanding nor it validity is necessary for the practice of the invention.

It is an additional advantage of the present invention that the molybdenum-platinum-oxide electrodes of the invention have been found to adhere well to the surface of oxide ceramics, including those known for use as the solid electrolyte in sodium heat engines, such as beta"-alumina. The use of molybdenum-platinum-oxide as the electrode material allows for further enhancement of the bond at the electrode-electrolyte interface and of electrical conductivity, should such enhancement be desired, through deposition of a layer of molybdenum-platinum between the solid electrolyte and the molybdenum-platinum-oxide. The molybdenum-platinum-oxide electrode exhibits a high electronic conductivity at the 600°–1000° C. operating temperatures typical for such generators.

Still further, this invention electrode is deposited by physical deposition methods, e.g., sputtering techniques, which advantageously provide an especially economical and rapid means by which to apply the molybdenum-platinum-oxide electrode film. Additionally, such electrode application techniques allow for fabrication of electrode/electrolyte articles of thin cross section and/or unusual shapes.

DETAILED DESCRIPTION OF THE INVENTION

Figure 1:
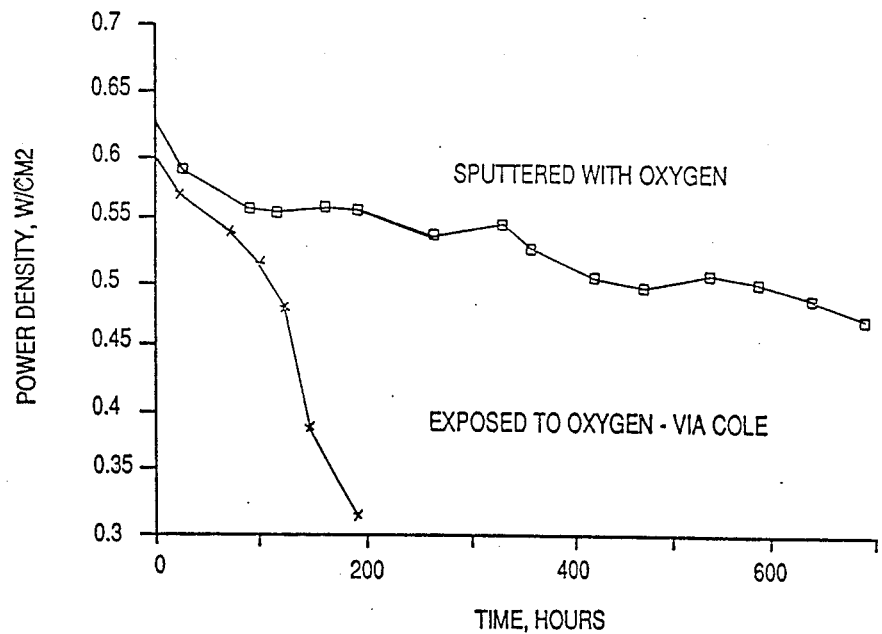
FIG. 1 is a graphical illustration showing the power density versus operation time for two SHE cells comparing a molybdenum electrode according to the Cole invention to a molybdenum oxide electrode according to the Schmatz invention.

The present invention article comprises a solid electrolyte carrying a thin film electrode comprising molybdenum-platinum-oxide, wherein the electrode has a thickness between about 0.5 and about 10 μm. Generally, molybdenum-platinum-oxide electrodes according to this invention having a thickness of about 1 to 3 μm on a solid electrolyte are preferred since they appear to be appropriate to carry adequate current in thermoelectric generators. The electrode film comprising molybdenum-platinum-oxide is deposited, on the solid electrolyte or on an intermediate layer as will hereinafter be described, by physical deposition of molybdenum and platinum in an atmosphere comprising at least 10% oxygen (by volume). The electrode comprises between about 5 and 20 mole % platinum based on the total moles of platinum and molybdenum, preferably between about 7 and 15 mole % platinum.

The molybdenum-platinum-oxide electrodes, having thickness of 1 to 3 μm and deposited in atmosphere comprising 10 to 100% oxygen, are generally found to have a surface resistance (often termed "sheet resistance") of less than about 150 ohms/square, more generally the surface resistance is between about 0.1 and about 150 ohms/square.

Many suitable physical deposition methods for depositing the electrode film according to this invention will be apparent to those skilled in the art in view of the present disclosure. Exemplary of such physical deposition methods is reactive sputtering. During reactive sputtering, molybdenum and platinum "react" with oxygen to form molybdenum oxide and platinum oxide as it deposits onto the solid electrolyte. In reactive sputtering, a main sputtering chamber consists of a vacuum system containing a dc magnetron sputtering gun with a molybdenum target over which strips of platinum are laid and to which a large negative voltage is applied. The atmosphere in the system used in any physical deposition method according to this invention comprises at least 10% by volume oxygen and may comprise 100% oxygen. If the atmosphere comprises less than 100% oxygen, the other gas of the atmosphere is inert, preferably being argon gas. Flow meters regulate the amount of oxygen and, when employed, inert gas, admitted into the system. The vacuum pumping system can be throttled to permit operation at a prescribed pressure developed by the gas(es). A usual operating pressure range is 1.5 to 5 millitorr, but can be as high as 50 millitorr. Gas flow rates are selected based on the size of the chamber and the pumping rate of the vacuum pumping system employed. For example, the argon flow rates for the reactive sputtering chamber of Examples 1-4 having a volume of 200 liters are optimally in the range of 10-28 standard cubic centimeters per minute (sccm); typically 22 sccm is used. In such cases, the reactive sputtering process begins with setting the inert gas flow rate and adjusting the pressure, after which the high voltage is turned on and the current is set. A plasma of positively charged inert gas ions is formed and ions are attracted to the negatively charged target or targets. That is, a single target of a molybdenum-platinum combination or multiple targets, individual targets of molybdenum and platinum, can be employed. The discussion that follows is applicable for single or multiple targets as described above. Oxygen is then admitted to the system. An exchange of energy occurs between the inert gas ion and the target material so that molybdenum and platinum atoms are dislodged, to be redeposited, and simultaneously reacted with oxygen, on any substrate in their line of sight. In this invention, they are deposited on the solid electrolyte. The solid electrolyte article is brought near the plasma at a selected distance. Generally, to produce a uniform film over an entire substrate, e.g., a solid electrolyte tube, requires that the substrate be rotated. If a 100% oxygen atmosphere is employed, the steps employed to carry out the deposition would be varied, as would be apparent to those skilled in the art in view of the present disclosure. Reactive sputtering techniques are discussed in "Reactive Sputter Deposition, A Quantitative Analysis", D. K. Hohnke, D. J. Schmatz and M. D. Hurley, Thin Solid Films, 118, 301-310 (1984), which article is hereby expressly incorporated by reference for such teachings.

While one physical deposition technique, i.e., reactive sputtering, has been discussed in detail above, such discussion is not meant to limit the deposition of the molybdenum-platinum-oxide electrode onto the solid electrolyte in this invention to deposition by reactive sputtering techniques. Other physical deposition methods which are suitable for use in this invention for applying the molybdenum-platinum-oxide electrode onto the solid electrolyte are described in "Deposition Technologies for Films and Coatings", R. F. Bunshoh, Editor, Noyes Publications, Park Ridge, N.J., 1982, which text is hereby expressly incorporated by reference for its teaching relative physical deposition techniques. Still other physical deposition methods, suitable for applying the molybdenum-platinum-oxide electrode to the solid electrolyte, are known to those skilled in the art and would be apparent in view of the present disclosure. For example, the molybdenum-platinum-oxide electrode can be deposited by ion beam sputtering of a molybdenum/platinum target in an atmosphere comprising oxygen. Ion plating is still another method which may be used to deposit the molybdenum-platinum-oxide electrode and comprises using either arc or electron beam evaporation of molybdenum and platinum in an atmosphere comprising oxygen. While the molybdenum-platinum-oxide electrode may be deposited by any of numerous physical deposition methods, as described herein, the electrodes of this invention comprising molybdenum-platinum-oxide are most conveniently deposited on the the solid electrolyte by reactive sputtering of molybdenum and platinum metal in the presence of a controlled pressure of oxygen or oxygen/argon gas.

It appears that the largest volume of oxygen incorporated in the electrode would probably produce the longest life. Such electrodes are those which are the thickest and have the largest percent oxygen incorporated. Very thick films, however, would require long sputtering times and may provide less than optimum passage of sodium through the electrode. Thicknesses in the range of 0.5 to 10 μm can be deposited generally in commercially reasonable times and provide the enhanced SHE performance and other advantages described above. A thickness of 0.5 μm is the minimum necessary to provide adequate conductivity within the film and thicknesses over 10μm produce less than optimum power and become economically unattractive to deposit. Embodiments of electrodes according to the present invention which contain about 5 to 20 mole % platinum exhibit significant improvements in performance with optimum performance generally obtained at 7 to 15 mole % platinum (of the combined moles of molybdenum plus platinum). Electrodes formed in atmospheres having oxygen contents between 10 and 100% by volume exhibit significant improvements in performance.

Thin films of optimum performance are found to be those produced by deposition with an oxygen contents in the range of 25 to 45%. Because of the lower sputtering rate at high oxygen contents, thick films may be more economically produced at lower oxygen contents. Selection of the optimal thickness of an electrode and oxygen content of the deposition atmosphere to form such an electrode according to this invention would be within the skill of those in the art in view of the present disclosure. It is possible to vary the physical deposition methods and conditions of physical deposition over a considerable range while producing electrodes capable of acceptable thermoelectric generator operation.

The morphology of the deposited molybdenum-platinum-oxide electrode films can be varied considerably while maintaining a desired composition thereof by adjusting the aforementioned parameters. It has been found that, e.g., in reactive sputtering, pressure along with the temperature affects the structure of the deposited molybdenum-platinum-oxide electrode film which can, during deposition, be made more dense at lower operating pressures and higher temperatures and more porous at higher operating pressures and lower temperatures. It has further been found that, e.g., in reactive sputtering, the structure of the molybdenum-platinum-oxide electrode can be made to grow with an equiaxed compact grain structure at low pressures and high temperatures and with a columnar or open fibrous structure (growth perpendicular to the solid electrolyte surface) at higher pressures and lower temperatures. It is believed that the columnar structure, with high oxide concentrations at the columnar interfaces, is more conducive to transport of the alkali metal through the molybdenum-platinum-oxide electrode film. Platinum in the form of an oxide or pure element may segregate to grain boundaries and retain the oxygen preferentially. However, while such columnar structure appears to be preferred, the invention article of this invention is not limited to such columnar molybdenum-platinum-oxide electrodes.

As has been previously mentioned herein, a layer of molybdenum, platinum, or molybdenum-platinum may be present between the molybdenum-platinum-oxide electrode film and the solid electrolyte. Such a layer may serve to enhance the bond at the electrode-electrolyte interface, should such be desired. The layer can be deposited by chemical and physical deposition methods, including the physical deposition methods previously described herein for depositing the molybdenum-platinum-oxide electrode film as would be apparent to those in the art in view of the present disclosure. Generally, if a layer of molybdenum, platinum, or molybdenum-platinum is employed between the molybdenum-platinum-oxide electrode film and the solid electrolyte, it is generally employed in a thickness of between about 10 and about 1000 angstroms. A layer of any of these materials can also be deposited on top of the electrode, preferably by physical deposition methods, to improve surface durability and decrease evaporation of the sodium molybdates formed in the electrode during operation. This top layer may be used as an alternative to the interlayer described above or in addition to it. This top layer, if employed, generally would have a thickness between about 10 and about 1000 angstroms. Transition layers containing varying amounts of molybdenum-platinum-oxide may be substituted for the thin pure molybdenum, platinum, or molybdenum-platinum layer(s).

The solid electrolyte of the article of this invention may be selected from a wide range of glass or polycrystalline ceramic materials which are commercially available and known to those skilled in the art. Among the glasses which may be used with thermoelectric generators employing alkali metals as working substances and which demonstrate unusually high resistance to attack by alkali metal are those having one of the two following compositions: (1) between about 47 and about 58 mole percent sodium oxide, about 0 to about 15, preferably about 3 to about 12, mole percent aluminum oxide, and about 34 to about 15 mole percent silicon dioxide; and (2) about 35 to about 65, preferably about 47 to about 58, mole percent sodium oxide, about 0 to about 30, preferably about 20 to about 30, mole percent aluminum oxide, and about 20 to about 50, preferably about 20 to about 30, mole percent boron oxide. These glasses may be prepared by conventional glass making procedures using the listed ingredients and firing at temperatures of about 2700° F.

Polycrystalline ceramic materials desirable as the solid electrolyte are bi- or multi- metal oxides. Among the polycrystalline bi- or multi- metal oxides most useful in thermoelectric generators are those of beta-type-alumina, generally sodium beta-type-alumina. There are two well-known crystalline forms of beta-type-alumina materials, beta-alumina and beta''-alumina, both of which demonstrate the generic beta-type-alumina crystalline structure comprising various layers of aluminum oxide held apart by layers of Al-O bond chains with, in the case of sodium beta or beta''-alumina, sodium ions occupying sites between the aforementioned layers and columns. Among the numerous polycrystalline beta-type-alumina materials useful as the solid electrolyte are the following.

1. Standard beta-type-alumina formed from compositions comprising at least about 80 percent by weight, preferably at least about 85 percent by weight of aluminum oxide and between about 5 and about 15 weight percent, preferably between about 8 and about 11 weight percent sodium oxide. Beta-alumina is a crystalline form which may be represented by the formula $Na_2O.11Al_2O_3$. The second crystalline form, beta''-alumina, may be represented by the formula $Na_2O.5Al_2O_3$. It will be noted that the beta''-alumina form contains approximately twice as much soda (sodium oxide) per unit weight of material as does the beta-alumina form. It is the beta''-alumina crystalline form which is preferred for use as the solid electrolyte of this invention. Each of these beta-type-alumina crystalline forms can be easily identified by its own characteristic X-ray diffraction pattern.

2. Boron oxide, $B_2O_3$, modified beta-type-alumina, wherein about 0.1 to about 1 weight percent of boron oxide is added to the composition.

3. Substituted beta-type-alumina, wherein the sodium ions of the composition are replaced, in part or in whole, with other positive ions which are preferably metal ions, e.g., potassium ions, lead ions, etc.

4. Beta-type-alumina which is modified by the addition of a minor proportion by weight of metal ions having a valence not greater than 2, such that the modified beta-type-alumina composition comprises a major proportion by weight of ions of aluminum and oxygen and a minor proportion by weight of a metal ion in crystal lattice combination with cations which migrate in relation to the crystal lattice as the result of an electric field. The preferred embodiment for use in such electrical conversion devices is that wherein the metal ion having a valence not greater than 2 is either lithium or magnesium or a combination of lithium and magnesium and the cation is sodium. These metals may be included in the composition in the form of lithium oxide or magnesium oxide or mixtures thereof in amounts ranging from 0.1 to about 5 weight percent. These metal ion, e.g., lithium, are generally added to stabilize the beta''-alumina in that form. Otherwise, at high temperatures, the beta''-alumina has a tendency to convert to the beta-alumina form. It is this stabilized beta''-alumina form which is preferred for the solid electrolyte material of this invention.

The solid electrolyte is shaped so as to conform with the design considerations of the thermoelectric generator. For example, in the previously mentioned patent to Saillant et al, the solid electrolyte is a tube closed at one end. Generally, such tubes have a wall thickness of about 1 millimeter or less. The solid electrolyte of the article of this invention is, however, not limited to any particular shape. The physical deposition method described in this invention for applying the molybdenum-platinum-oxide electrode film advantageously allows for applying molybdenum-platinum-oxide electrodes to solid electrolytes of unusual shapes. With the advent of beta-type-alumina or other ceramics of high structural integrity, solid electrolyte wall thicknesses are as low as 100 μm or less. It has been discovered that reducing the thickness of the solid electrolyte improves overall efficiency by reduction of bulk resistance.

METHOD FOR TESTING POWER OUTPUT AND SURFACE RESISTANCE OF ELECTRODES

The testing of sodium heat engine electrodes, as is done in the following examples, is initiated by assembling an electrolyte tube coated with a molybdenum-platinum-oxide electrode into a complete sodium heat engine cell. The electrode performance is generally determined by measuring the current/voltage relationship of the electrode as a function of temperature. Electrical leads are connected to the sodium metal in the aforementioned first reaction zone of the cell, the sodium metal being the negative electrode, and to the positive electrode comprising the molybdenum-platinum-oxide film carried on the solid electrolyte tube in the second reaction zone. Between these two leads, a variable resistance and a current meter are placed in series. Changes in the resistance are then used to sweep the current delivered to this circuit by the sodium heat engine system through a range of values and the current in the circuit and the cell voltage are recorded on the axes of an X-Y recorder. The maximum power output of the electrode can then be determined graphically by examination of the I-V relation. The in-plane or "surface" electronic resistance (often referred to as "sheet" resistance) of the electrode can be measured by the conventional 4 terminal methods known to those skilled in the art. Values of surface resistance are generally given in units of ohms per square, the resistance between opposite edges of a square section of the film.

The following examples illustrate the preferred aspects of this invention but are not meant to limit the scope of this invention. Those in the art will appreciate that many modifications can be made within the scope of the invention that will achieve the electrode articles of this invention.

EXAMPLE 1

A reactive sputtering chamber having a vacuum system, a dc magnetron sputtering gun and a molybdenum target with platinum strips consisting of 10% of the target area was used to deposit a molybdenum-platinum-oxide electrode film on a beta''-alumina tube in this example. The sputtering was done in an atmosphere comprising 37% oxygen and 63% argon (by volume) with the planar magnetron target described above comprising 10 mole % platinum. In this example, a thin layer of molybdenum-platinum (10 mole % platinum) was deposited under and over the oxygen containing film.

Figure 2:
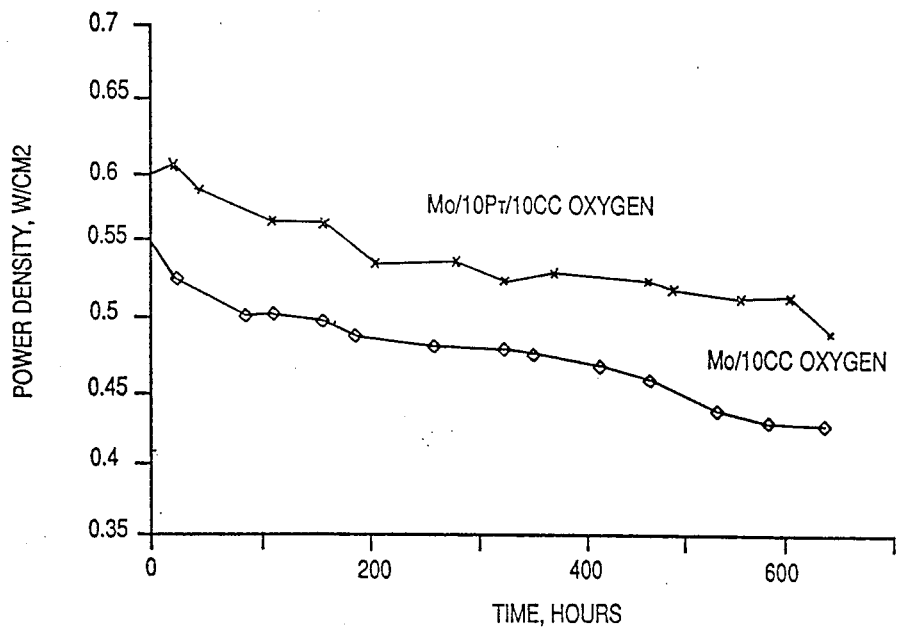
FIG. 2 is a graphical illustration showing the power density versus operation time for two SHE cells comparing a molybdenum-platinum-oxide electrode according to this invention to a molybdenum oxide electrode according to the Schmatz invention, in each case the electrodes being made by physical deposition in an atmosphere comprising 37% oxygen (10 cc flow).

To begin, a flow rate of 22 sccm of argon was established and a pressure of 5.5 millitorr was developed in a throttled vacuum system. A current of 0.8 amperes was set which produced a cathode voltage of 320 volts. The rotation of the beta''-alumina tube was started and the shutter separating the tube from the plasma was opened. The tube was coated for 5 minutes (2 revolutions) producing a molybdenum-platinum (underlayer) film 0.1 um thick. Oxygen was added at a rate of 10 sccm and the throttle valve adjusted to maintain a pressure of 5.5 millitorr. Because of the interactive effect of the two gases, the argon flow decreased to 17 sccm producing an oxygen content of 37% by volume (10 cc flow). The voltage increased to 480 volts and the deposition continued for 2.5 hours producing a molybdenum-platinum-oxide film 2.5 μm thick. The oxygen flow was turned off and sputtering of molybdenum-platinum continued for 5 minutes (throttle valve adjusted and voltage decreased to 320 volts). According to this last step, a 0.1 um layer of molybdenum-platinum was produced over the molybdenum-platinum-oxide layer. A transition layer from the molybdenum-platinum to the oxygen containing layer is produced at each interface as oxygen is added or reduced. This electrode produced a maximum power output of 0.60 watts/cm$^2$ at 800° C. and remained above 0.50 watts/cm$^2$ for 662 hours. FIG. 2 shows data for this electrode versus an electrode of similar composition without, however, platinum. The power density of the electrode of this example averages about 10% more or about 0.05 watts/cm$^2$ more than for the electrode without platinum over the test period of 662 hours. Further testing could have continued had the test cell been refilled with sodium.

EXAMPLE 2

Reactive sputtering is employed to deposit a molybdenum-platinum-oxide electrode film according to this invention onto a beta''-alumina tube in this example by means of the reactive sputtering chamber described in Example 1. The sputtering is done in a mixture of 37% oxygen and 63% argon. A flow rate of 22 cm$^3$/min (sccm) of argon is established and a pressure of 5.5 millitorr is developed in the throttled vacuum system. A current of 0.8 amperes is set which produces a cathode (target) voltage of 320 volts. Oxygen is introduced at a rate of 10 sccm and the throttle valve adjusted to maintain 5.5 millitorr pressure. Because of an interactive effect between the two gases the argon flow decreases to 17 sccm, and produces 37% oxygen (by volume). When oxygen is added, the voltage increases to 480 volts. The shutter separating the tube from the plasma is opened and the tube is coated for 2.5 hours, producing a film thickness of 3 μm. This electrode which consists of molybdenum-10 mole % platinum-oxygen is expected to produce an initial power output of 0.60 watts/cm² at 800° C. and after 700 hours of operation to exhibit a power output of 0.5 watts/cm². Further testing can be continued if the test cell is refilled with sodium.

EXAMPLE 3

Figure 3:
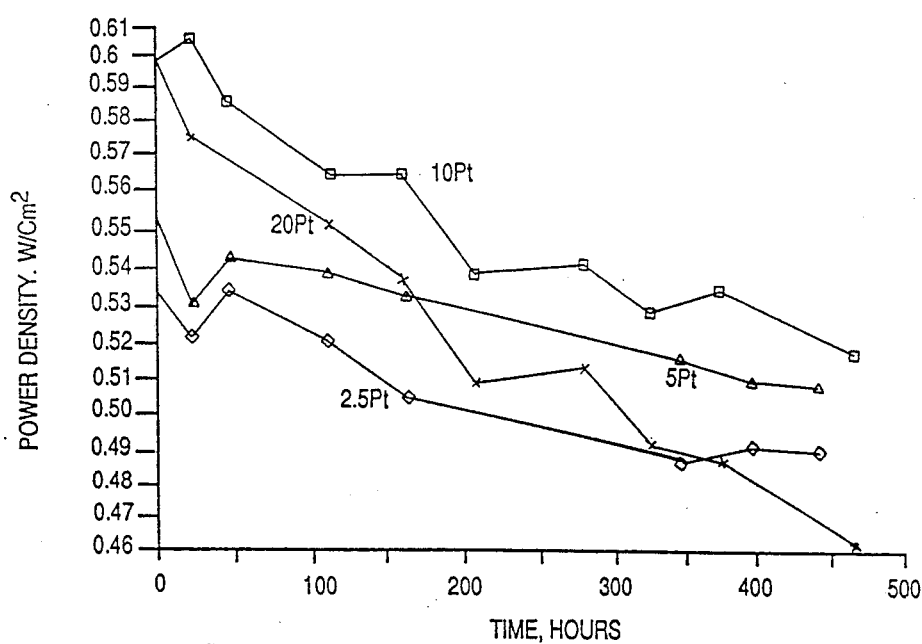
FIG. 3 is a graphical representation showing the power density versus operation time for four SHE cells employing molybdenum-platinum-oxide electrodes of 3.0 μm thickness according to this invention made by physical deposition of molybdenum and platinum, the platinum comprising 2.5, 5.0, 10.0 and 20.0 mole % of the total of the molybdenum and platinum, in an atmosphere comprising 37% oxygen (10 cc flow).

Reactive sputtering was employed to deposit a molybdenum-platinum-oxide electrode film according to this invention onto a beta"-alumina tube with varying platinum concentrations, 2.5, 5 and 20 mole %, in this example by means of the reactive sputtering chamber described in Example 1. The sputtering was done essentially according to the procedure of Example 1 in 37% oxygen and 63% argon with a planar magnetron molybdenum target with the appropriate area covered with platinum to produce 2.5, 5 and 20 mole % platinum. The performance of these electrodes varied with the concentration of platinum of the electrode film as can be seen in FIG. 3. The data from FIG. 2 relative the molybdenum-platinum-oxide electrode is used for the 10 mole % platinum curve in FIG. 3. Optimum power is obtained at 10 mole % platinum with 37% oxygen (10 cc flow) over 470 hours.

EXAMPLE 4

Figure 4:
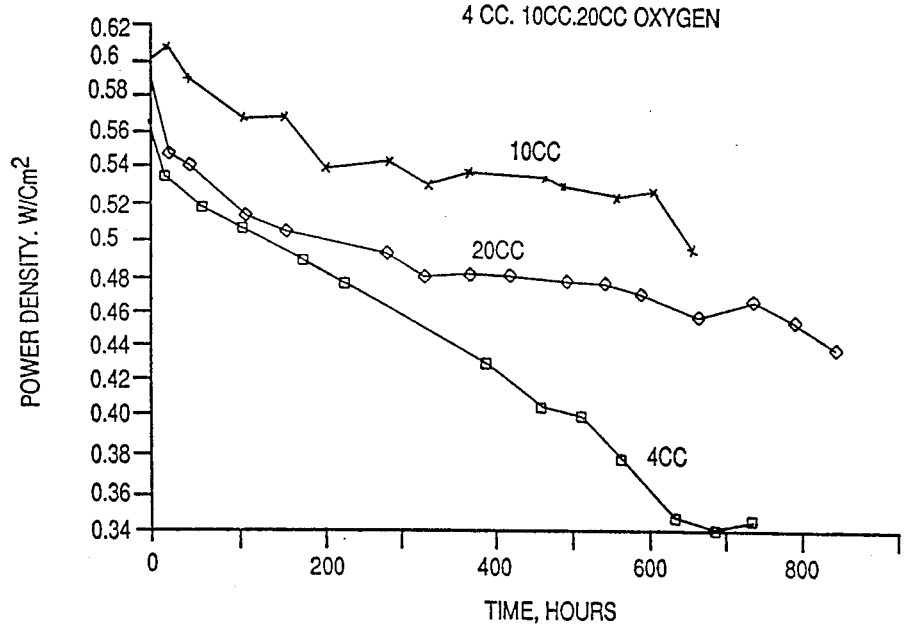
FIG. 4 is a graphical representation showing maximum power density versus operation time for three SHE cells employing a 3 micron thick molybdenum-platinum-oxide electrode made by physical deposition of molybdenum and platinum (10 mole % platinum) in an atmosphere comprising 15%, 37% and 62% oxygen (4 cc, 10 cc and 20 cc flow) according to this invention.

Reactive sputtering was employed to deposit two molybdenum-platinum-oxide electrode films onto a beta"-alumina tube in this example by means of the reactive sputtering chamber described in Example 1. The sputtering was done according to the procedure of Example 1 (10 mole % platinum), but in two different oxygen atmospheres, one comprising 15% oxygen and the other comprising 62% oxygen by volume, (4 and 20 cc flow). As can be seen from FIG. 4, the two electrodes made at these oxygen levels exhibited lower output and shorter lives at 800° C. as compared to that made at 37% oxygen (molybdenum-platinum oxide electrode data from FIG. 2). Optimum performance is obtained with a 37% oxygen (10 cc flow) with 10 mole % platinum molybdenum-platinum-oxide electrode over 662 hours.

EXAMPLE 5

In this example, reactive ion-plating is used to deposit a molybdenum-platinum-oxide electrode according to this invention onto a beta"-alumina tube. The plating is carried out in an ion plating chamber having a vacuum system comprising an electron beam. Molybdenum and 10 mole % platinum is vaporized from a molybdenum-10 mole % platinum target by the electron beam. The vaporized molybdenum and platinum passes through a gaseous glow discharge on its way to the beta"-alumina tube, which ionizes some of the vaporized atoms. The glow discharge is produced by biasing the beta tube to a high negative potential (3KV) and admitting argon into the throttled vacuum system within the chamber at a pressure of about 20 millitorr. The tube is bombarded by high energy gas ions which effectively clean the tube surface. Oxygen is then admitted to the chamber which allows the deposition of molybdenum-platinum-oxide on the beta"-alumina tube. The composition is determined by the ratio of the oxygen to the total volume of gas, (oxygen and argon). The electrode is applied to a thickness of 3 μm. The power output of the electrode is expected to be 0.60 watts/cm2 at 800° C.

I claim:

1. An article suitable for use in thermoelectric generators, which article comprises a solid electrolyte carrying thereon a thin film electrode comprising molybdenum-platinum-oxide deposited by physical deposition of molybdenum and platinum in an atmosphere comprising at least about 10 percent oxygen by volume, said thin film electrode (a) having a thickness between about 0.5 and about 10 μm and (b) comprising between about 5 and 20 mole percent platinum.

2. The article according to claim 1, wherein said electrode comprising molybdenun-platinum-oxide comprises between 7 and 15 mole percent platinum.

3. The article according to claim 1, wherein said article further comprises (i) a thin layer of material between said film and said solid electrolyte, (ii) a thin layer of material on the surface of said film, or (iii) a thin layer of material between said film and said solid electrolyte and a thin layer of material on the surface of said film, in each instance said material being individually selected from molybdenum, platinum, and molybdenum-platinum.

4. The article according to claim 3, wherein said layer of material has a thickness between about 10 and about 1000 Angstroms.

5. The article according to claim 1, wherein said film comprising molybdenum-platinum-oxide has been deposited by a physical deposition method selected from (i) reactive sputtering of molybdenum-platinum in an atmosphere comprising oxygen, (ii) ion plating of molybdenum-platinum in an atmosphere comprising oxygen, and (iii) ion beam sputtering of molybdenum-platinum in an atmosphere comprising oxygen.

6. The article according to claim 1, wherein said solid electrolyte comprises beta-alumina.

7. The article according to claim 1, wherein said solid electrolyte comprises beta"-alumina.

8. A method for making an article suitable for use in thermoelectric generators, which article comprises a solid electrolyte carrying a film comprising molybdenum-platinum oxide, which method comprises:
depositing a film comprising molybdenum-platinum-oxide onto a solid electrolyte to a thickness of between about 0.5 and about 10 μm, said film being deposited by physical deposition of molybdenum and platinum in an atmosphere comprising at least 10 percent oxygen by volume.

9. The method according to claim 8, wherein said electrode comprising molybdenum-platinum-oxide comprises between 7 and 15 mole percent platinum.

10. The method according to claim 8, wherein said method further comprises depositing a layer of material selected from molybdenum, platinum, and molybdenum-platinum onto said solid electrolyte prior to depositing said film comprising molybdenum-platinum-oxide on said solid electrolyte.

11. The method according to claim 8, wherein said method further comprises depositing a layer of material selected from molybdenum, platinum, and molybdenum-platinum onto said film comprising molybdenum-platinum-oxide.

12. The method according to claim 8, wherein said method further comprises (i) depositing a layer of material selected from molybdenum, platinum, and molybdenum-platinum onto said solid electrolyte prior to depositing said film comprising molybdenum-platinum-oxide on said solid electrolyte and (ii) depositing a layer of material selected from molybdenum, platinum, and molybdenum-platinum onto said film comprising molybdenum-platinum-oxide.

13. The method according to claim 8, wherein said layer of material has a thickness between about 10 and about 1000 Angstroms.

14. The method according to claim 8, wherein said film comprising molybdenum-platinum-oxide is deposited by a physical deposition method selected from (i) reactive sputtering of molybdenum-platinum in an atmosphere comprising oxygen, (ii) ion plating of molybdenum-platinum in an atmosphere comprising oxygen, and (iii) ion beam sputtering of molybdenum-platinum in an atmosphere comprising oxygen.

15. The method according to claim 8, wherein said solid electrolyte comprises beta-alumina.

16. The method according to claim 16, wherein said solid electrolyte comprises beta"-alumina.

17. An article suitable for use in thermoelectric generators, which article comprises a solid electrolyte carrying thereon a thin film electrode comprising molybdenum-platinum-oxide deposited by reactive sputtering of molybdenum and platinum in an atmosphere comprising at least 10 percent oxygen by volume, said film (a) having a thickness between about 0.5 and about 10 $\mu$m and (b) comprising platinum in an amount between about 5 and 20 mole percent, and said solid electrolyte comprising beta-alumina.

18. The article according to claim 17, wherein said electrode comprising molybdenum-platinum-oxide comprises between about 7 and 15 mole percent platinum.

19. An alkali metal thermoelectric generator device which comprises an article comprising a solid electrolyte carrying thereon a thin film electrode comprising molybdenum-platinum-oxide deposited by physical deposition of molybdenum and platinum in an atmosphere comprising at least about 10 percent oxygen by volume, said thin film electrode (a) having a thickness between about 0.5 and about 10 $\mu$m and (b) comprising between about 5 and 20 mole percent platinum.

20. The device according to claim 19, wherein said electrode comprising molybdenun-platinum-oxide comprises between 7 and 15 mole percent platinum.

* * * * *